United States Patent
Riker et al.

(10) Patent No.: US 9,476,122 B2
(45) Date of Patent: Oct. 25, 2016

(54) WAFER PROCESSING DEPOSITION SHIELDING COMPONENTS

(71) Applicant: Applied Materials, Inc., Santa Clara, CA (US)

(72) Inventors: Martin Lee Riker, Milpitas, CA (US); Keith A. Miller, Mountain View, CA (US); Anantha K. Subramani, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/204,873

(22) Filed: Mar. 11, 2014

(65) Prior Publication Data

US 2014/0190822 A1 Jul. 10, 2014

Related U.S. Application Data

(62) Division of application No. 13/457,441, filed on Apr. 26, 2012, now Pat. No. 8,696,878, which is a division of application No. 12/423,444, filed on Apr. 14, 2009, now abandoned.

(60) Provisional application No. 61/049,334, filed on Apr. 30, 2008, provisional application No. 61/045,556, filed on Apr. 16, 2008.

(51) Int. Cl.
*C23C 16/458* (2006.01)
*H01J 37/34* (2006.01)
(Continued)

(52) U.S. Cl.
CPC ........... *C23C 16/4585* (2013.01); *C23C 14/34* (2013.01); *C23C 14/50* (2013.01);
(Continued)

(58) Field of Classification Search
CPC ... C23C 16/4585; C23C 14/34; C23C 14/50; C23C 14/564; H01J 37/3441; H01J 37/32642; H01J 37/32651; H01J 37/32623; H01J 37/32082

USPC ................ 118/500, 728; 204/298.11, 298.15
See application file for complete search history.

(56) References Cited

U.S. PATENT DOCUMENTS 5,632,873 A * 5/1997 Stevens et al. .......... 204/298.15
5,690,795 A 11/1997 Rosenstein et al.
(Continued)

FOREIGN PATENT DOCUMENTS

JP 02-34449 12/1990
JP 07-126832 5/1995
(Continued)

OTHER PUBLICATIONS

Official Letter dated Jul. 29, 2013, from Japan Patent Office for corresponding Japan Patent Application No. 2011-505129.
(Continued)

*Primary Examiner* — Michael Band
(74) *Attorney, Agent, or Firm* — Patterson & Sheridan, LLP

(57) ABSTRACT

Embodiments described herein generally relate to components for a semiconductor processing chamber, a process kit for a semiconductor processing chamber, and a semiconductor processing chamber having a process kit. In one embodiment a lower shield for encircling a sputtering target and a substrate support is provided. The lower shield comprises a cylindrical outer band having a first diameter dimensioned to encircle the sputtering surface of the sputtering target and the substrate support, the cylindrical band comprising a top wall that surrounds a sputtering surface of a sputtering target and a bottom wall that surrounds the substrate support, a support ledge comprising a resting surface and extending radially outward from the cylindrical outer band, a base plate extending radially inward from the bottom wall of the cylindrical band, and a cylindrical inner band coupled with the base plate and partially surrounding a peripheral edge of the substrate support.

9 Claims, 8 Drawing Sheets

(51) Int. Cl.
  *H01J 37/32*    (2006.01)
  *C23C 14/34*    (2006.01)
  *C23C 14/56*    (2006.01)
  *C23C 14/50*    (2006.01)

(52) U.S. Cl.
  CPC ...... *C23C 14/564* (2013.01); *H01J 37/32623* (2013.01); *H01J 37/32633* (2013.01); *H01J 37/3408* (2013.01); *H01J 37/3441* (2013.01)

(56) References Cited

U.S. PATENT DOCUMENTS

| | | | |
|---|---|---|---|
| 5,803,977 | A | 9/1998 | Tepman et al. |
| 5,942,042 | A | 8/1999 | Gogh |
| 6,034,863 | A | 3/2000 | Marohl et al. |
| 6,051,122 | A * | 4/2000 | Flanigan ............ 204/298.11 |
| 6,059,945 | A | 5/2000 | Fu et al. |
| 6,582,569 | B1 | 6/2003 | Chiang et al. |
| 6,699,375 | B1 | 3/2004 | Crocker |
| 6,723,214 | B2 | 4/2004 | Stimson et al. |
| 6,730,174 | B2 | 5/2004 | Liu et al. |
| 6,743,340 | B2 | 6/2004 | Fu |
| 6,797,131 | B2 | 9/2004 | Liu et al. |
| 6,899,798 | B2 | 5/2005 | Weldon et al. |
| 7,041,200 | B2 | 5/2006 | Le et al. |
| 7,163,607 | B2 | 1/2007 | Stimson et al. |
| 7,294,245 | B2 | 11/2007 | Fu |
| 7,520,969 | B2 | 4/2009 | Miller |
| 7,981,262 | B2 | 7/2011 | Pavloff et al. |
| 2002/0090464 | A1 | 7/2002 | Jiang et al. |
| 2004/0216998 | A1 | 11/2004 | Fu |
| 2005/0199491 | A1 | 9/2005 | Gung et al. |
| 2006/0054090 | A1 | 3/2006 | Kurita et al. |
| 2006/0090706 | A1 | 5/2006 | Miller et al. |
| 2007/0102286 | A1 | 5/2007 | Scheible et al. |

FOREIGN PATENT DOCUMENTS

| | | |
|---|---|---|
| JP | H07126832 A | 5/1995 |
| JP | 09-202969 | 8/1997 |
| JP | H09202969 A | 8/1997 |
| JP | 2001140054 A | 5/2001 |
| JP | 2006-1210054 | 5/2006 |
| JP | 2006-140473 A | 6/2006 |
| JP | 2007146290 A | 6/2007 |
| KR | 2002-0001354 A | 1/2002 |
| KR | 2005-0069452 A | 7/2005 |
| KR | 2007-0045060 A | 5/2007 |
| KR | 20070046765 A | 5/2007 |
| WO | WO-2007103902 A2 | 9/2007 |

OTHER PUBLICATIONS

PCT International Search Report and Written Opinion dated Jan. 7, 2010 for International Application No. PCT/US2009040487.
First Office Action dated Jan. 29, 2012 for Chinese Patent Application No. 200980113536.1.
PCT International Search Report and Written Opinion dated Jan. 7, 2010 for corresponding International Application No. PCT/US2009/040487.
Official Letter dated Aug. 6, 2013, from Japan Patent Office for corresponding Japan Patent Application No. 2011-505129.
Notice of Reasons for Rejection dated Apr. 2, 2013 for Japanese Patent Application No. 2010-542317.

* cited by examiner

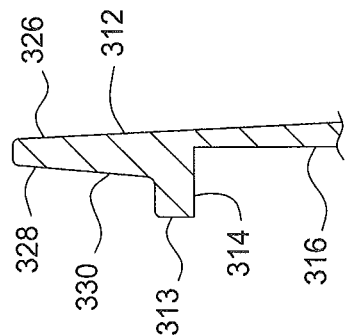
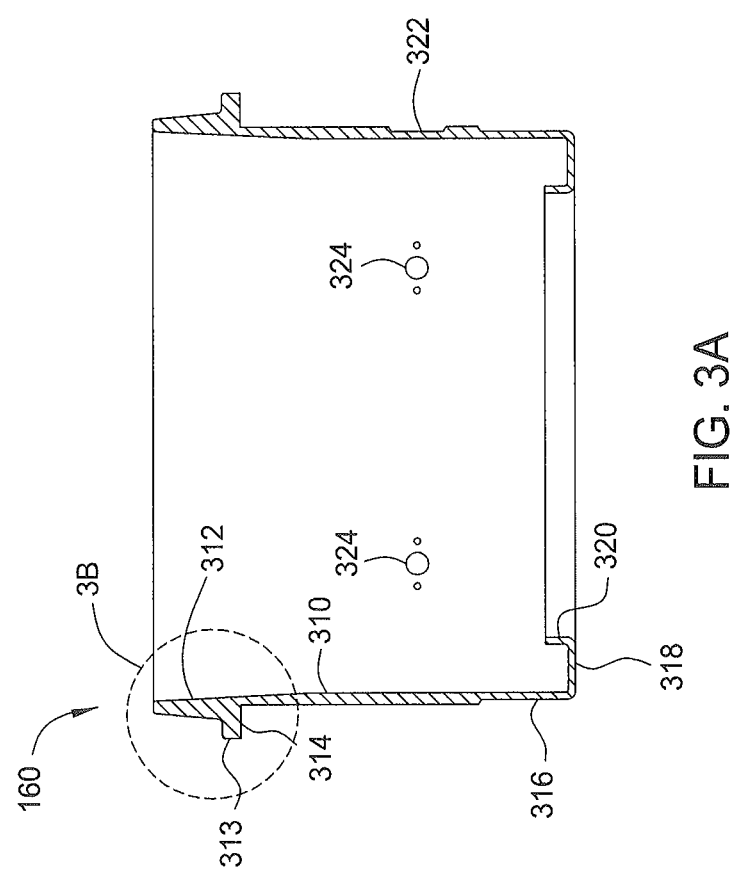

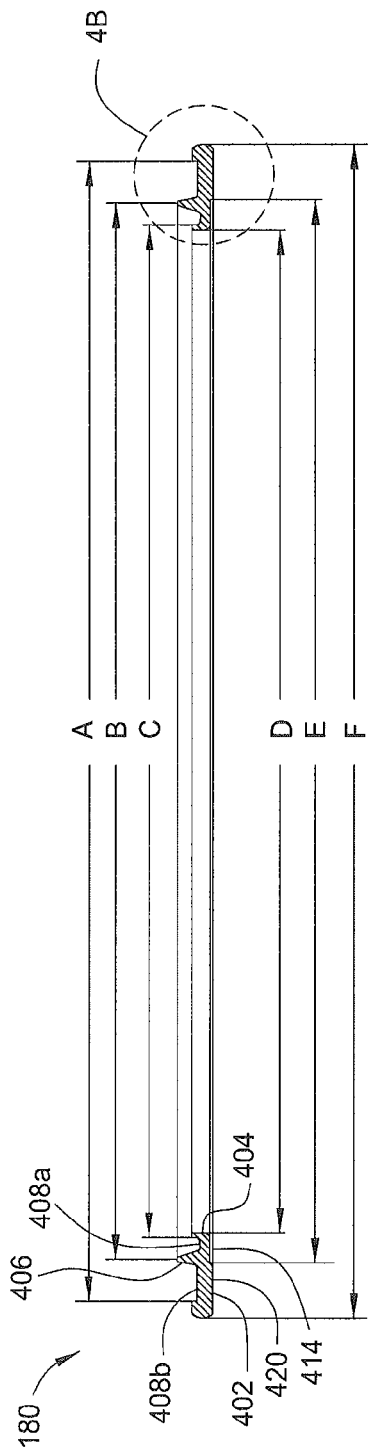
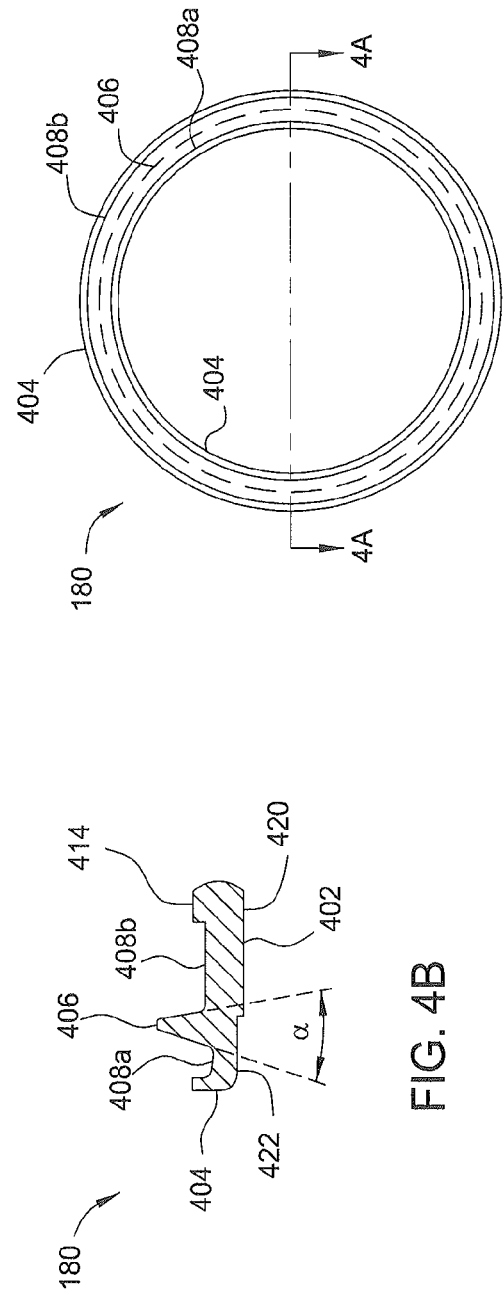
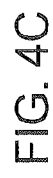
FIG. 4A
FIG. 4B
FIG. 4C

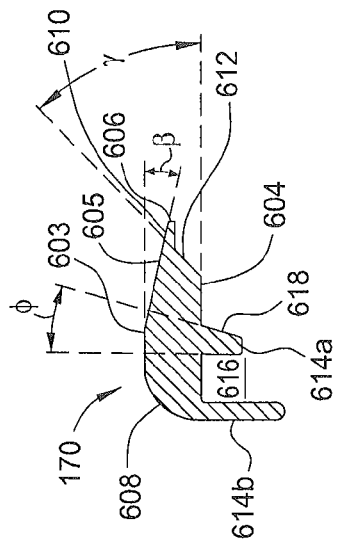
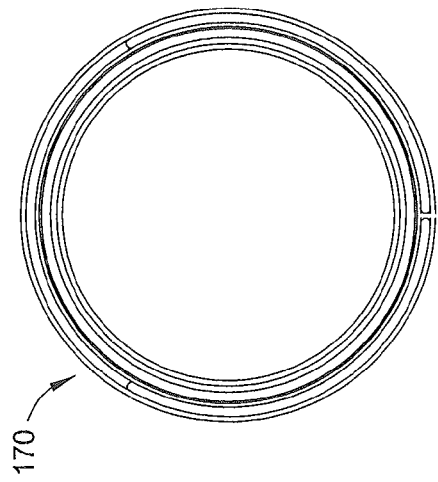
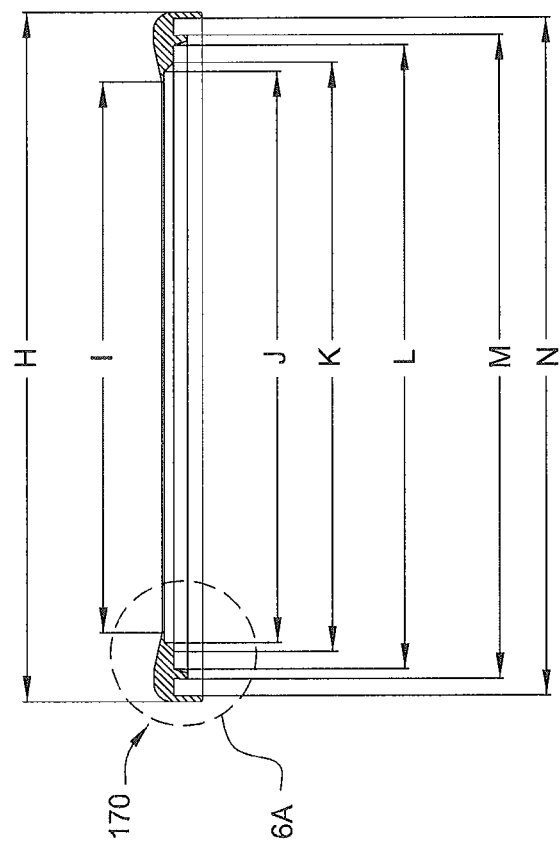
FIG. 6A
FIG. 6B
FIG. 6C

WAFER PROCESSING DEPOSITION SHIELDING COMPONENTS

CROSS-REFERENCE TO RELATED APPLICATIONS

This application claims priority to and is a divisional of co-pending U.S. patent application Ser. No. 13/457,441, filed Apr. 26, 2012, which claims priority to and is a divisional application of U.S. patent application Ser. No. 12/423,444, filed Apr. 14, 2009, which claims benefit of U.S. Provisional Patent Application Ser. No. 61/049,334, filed Apr. 30, 2008, and U.S. Provisional Patent Application Ser. No. 61/045,556, filed Apr. 16, 2008, all of which are herein incorporated by reference in their entirety.

BACKGROUND OF THE INVENTION

1. Field of the Invention

Embodiments described herein generally relate to components for a semiconductor processing chamber, a process kit for a semiconductor processing chamber, and a semiconductor processing chamber having a process kit. More specifically, embodiments described herein relate to a process kit that includes a ring assembly and multiple shields suitable for use in a physical vapor deposition chamber.

2. Description of the Related Art

In the manufacture of integrated circuits and displays, a substrate such as a semiconductor wafer or display panel, is placed in a substrate processing chamber and processing conditions are set in the chamber to deposit or etch material on the substrate. A typical process chamber comprises chamber components that include an enclosure wall that encloses a process zone, a gas supply to provide a process gas in the chamber, a gas energizer to energize the process gas to process the substrate, a gas exhaust to remove spent gas and maintain a gas pressure in the chamber, and a substrate support to hold the substrate. Such chambers can include, for example, sputtering (PVD), chemical vapor deposition (CVD), and etching chambers. In PVD chambers, a target is sputtered by energized gas to sputter target material which then deposits on the substrate facing the target.

In sputtering processes, the material sputtered from the target also deposits on the edges of chamber components surrounding the target which is undesirable. The peripheral target regions have a dark-space region in which sputtered material redeposit as a result of ion scattering in this area. Accumulation and build-up of the sputtered material in this region is undesirable as such accumulated deposits require disassembly and cleaning or replacement of the target and surrounding components, can result in plasma shorting, and can cause arcing between the target and the chamber wall. These deposits also often debond and flake off due to thermal stresses to fall inside and contaminate the chamber and its components.

A process kit comprising a shield, cover ring and deposition ring arranged about the substrate support and chamber sidewalls, is often used to receive the excess sputtered material to protect and prevent deposition on the chamber walls and other component surfaces. Periodically, the process kit components are dismantled and removed from the chamber for cleaning off accumulated deposits. Thus it is desirable to have process kit components which are designed to receive and tolerate ever larger amounts of accumulated deposits without sticking to each other or to the substrate, or resulting in flaking off of the deposits between process clean cycles. It is further desirable to have a process kit comprising fewer parts or components, as well as having components that are shaped and arranged in relationship to one another to reduce the amounts of sputtered deposits formed on the internal surfaces of the process chamber.

Another problem arises when the chamber liners and shields heat up to excessively high temperatures due to exposure to the sputtering plasma in the chamber and poor thermal conductivity between the shield and chamber components. For example, it is difficult to control the temperature of shields made of low thermal conductivity material. The thermal resistances at contact interfaces with supporting components, such as adapters, also affect shield temperatures. Low clamping forces between the shield and adapter can also give rise to heating up of the shield. Without thermal control, the temperature of the shields cycles between idle room-temperature conditions and high temperatures during sequential substrate processing. When process deposits of high-stress metal are deposited onto the shields and subjected to large temperature swings, the adhesion of the film to the shield as well as the cohesion of the film to itself, can decrease dramatically due to, for example, a mismatch of the coefficients of thermal expansion between the film and the underlying shield. It is desirable to reduce the temperatures of shields and liners during substrate processing to reduce flaking of accumulated deposits from the shield surfaces.

Another problem with conventional substrate processing chamber and PVD processes arises due to poor gas conductance from the chamber. A high-conductance gas flow pathway is needed to both supply the necessary process gasses to the process cavity and to properly exhaust spent process gas. However, the shields and other chamber components of the process kit that line the chamber walls can substantially reduce gas conductance flows. Placing apertures in these components while increasing gas conductance therethrough, also allow line-of-sight sputtering deposits to exit the process zone through the gas conductance holes to deposit on the chamber walls. Such holes can also cause plasma leakage from within the processing cavity to surrounding chamber regions. Also, chamber components that incorporate such holes have other shortcomings including, but not limited to, requirement of additional parts, their relative flimsiness, tolerance stack-ups of multiple parts, and poor thermal conductivity at interfaces.

Thus it is desirable to have process kit components that increase thermal conductivity while reducing the flaking of process deposits from component surfaces. It is further desirable to control the temperature of the shields and liners so that they do not cycle between excessively high and low temperatures during plasma processing. It is also desirable to increase overall gas conductance while preventing line-of-sight deposition outside the process zone and reduce plasma leakage.

SUMMARY OF THE INVENTION

Embodiments described herein generally relate to components for a semiconductor processing chamber, a process kit for a semiconductor processing chamber, and a semiconductor processing chamber having a process kit. In one embodiment a lower shield for encircling a sputtering target and a substrate support is provided. The lower shield comprises a cylindrical outer band having a first diameter dimensioned to encircle the sputtering surface of the sputtering target and the substrate support, the cylindrical band comprising a top wall that surrounds a sputtering surface of a sputtering target and a bottom wall that surrounds the substrate support, a support ledge comprising a resting surface and extending radially outward from the cylindrical outer band, a base plate extending radially inward from the bottom wall of the cylindrical band, and a cylindrical inner band coupled with the base plate and partially surrounding a peripheral edge of the substrate support.

In another embodiment, a deposition ring for encircling a peripheral wall of a substrate support in a processing chamber is provided. The deposition ring comprises an annular band for surrounding the peripheral wall of the substrate support, the annular band comprising an inner lip which extends transversely from the annular band and is substantially parallel to the peripheral wall of the substrate support, wherein the inner lip defines an inner perimeter of the deposition ring which surrounds the periphery of the substrate and substrate support to protect regions of the support that are not covered by the substrate during processing to reduce or even entirely preclude deposition of sputtering deposits on the peripheral wall, and a v-shaped protuberance that extends along a central portion of the band with a first radially inward recess adjacent to the inner lip and a second radially inward recess on either side of the v-shaped protuberance.

In yet another embodiment, a cover ring for encircling and at least partially shadowing a deposition ring from sputtering deposits is provided. The deposition ring comprises an annular wedge comprising a top surface, an inclined top surface sloped radially inward and coupled with the top surface having an inner periphery and an outer periphery, a bottom surface to rest upon a ledge of a deposition ring, wherein the top surface is substantially parallel to the bottom surface, and a projecting brim coupled with the top surface by the inclined top surface in cooperation with the projecting brim block line-of-sight deposition from exiting the interior volume and entering the chamber body cavity, and an inner cylindrical band extending downward from the annular wedge, the inner cylindrical band having a smaller height than the outer cylindrical band.

In yet another embodiment a process kit for a semiconductor processing chamber is provided. The process kit comprises a lower shield, a middle shield, and a ring assembly positioned about a substrate support in a processing chamber to reduce deposition of process deposits on the internal chamber components and an overhanging edge of the substrate is provided. The lower shield comprises an outer cylindrical band having a top wall that surrounds a sputtering target and a bottom wall that surrounds the substrate support, a support ledge, and an inner cylindrical band surrounding the substrate support. The ring assembly comprises a deposition ring and a cover ring.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 3A is a cross-sectional view of a lower shield according to one embodiment described herein;

FIG. 3B is a partial sectional view of the lower shield of FIG. 3A;

FIG. 4A is a cross-sectional view of a deposition ring according to one embodiment described herein;

FIG. 4B is a partial sectional view of the deposition ring according to one embodiment described herein;

FIG. 4C is a top view of the deposition ring of FIG. 4A;

FIG. 6A is a partial sectional view of a cover ring according to one embodiment described herein;

FIG. 6B is a cross-sectional view of the cover ring of FIG. 6A; and

FIG. 6C is a top view of the cover ring of FIG. 6A.

DETAILED DESCRIPTION

Embodiments described herein generally provide a process kit for use in a physical deposition chamber (PVD) chamber. The process kit has advantageously provided a reduction in RF harmonics and stray plasma outside the process cavity, which promotes greater process uniformity and repeatability along with longer chamber component service life.

Figure 1:
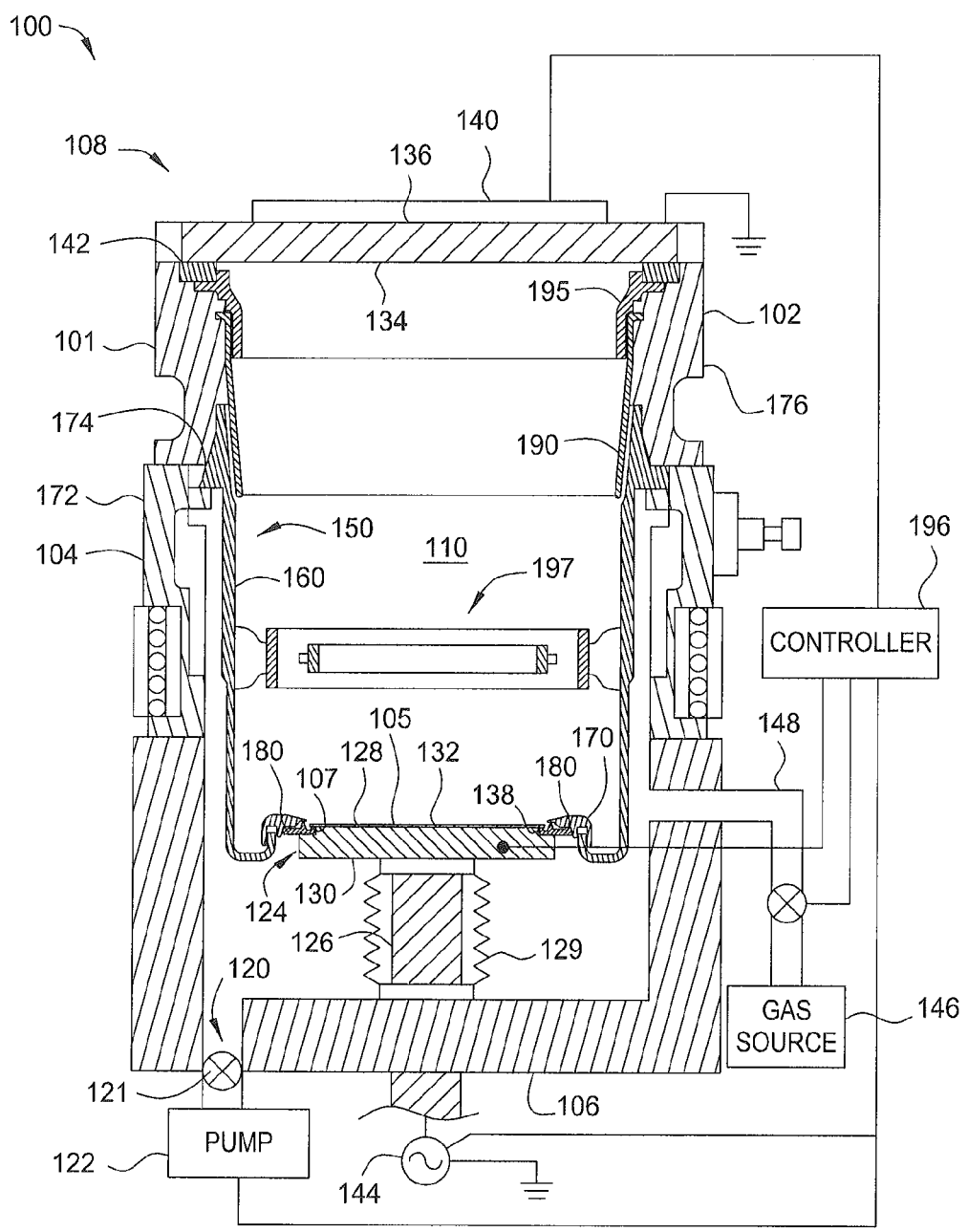
FIG. 1 is a simplified sectional view of a semiconductor processing system having one embodiment of a process kit described herein.

FIG. 1 depicts an exemplary semiconductor processing chamber 100 having one embodiment of a process kit 150 capable of processing a substrate 105. The process kit 150 includes a one-piece lower shield 160, an interleaving cover ring 170, a deposition ring 180, and a middle shield 190. In the embodiment shown, the processing chamber 100 comprises a sputtering chamber, also called a physical deposition or PVD chamber, capable of depositing titanium, aluminum oxide, aluminum, copper, tantalum, tantalum nitride, tungsten, or tungsten nitride on a substrate. Examples of suitable PVD chambers include the ALPS® Plus and SIP ENCORE® PVD processing chambers, both commercially available from Applied Materials, Inc., Santa Clara, of California. It is contemplated that processing chambers available from other manufactures may also be utilized to perform the embodiments described herein.

The processing chamber 100 includes a chamber body 101 having enclosure walls 102 and sidewalls 104, a bottom wall 106, and a lid assembly 108 that enclose an interior volume 110 or plasma zone. The chamber body 101 is typically fabricated from welded plates of stainless steel or a unitary block of aluminum. The sidewalls 104 generally contain a slit valve (not shown) to provide for entry and egress of a substrate 105 from the processing chamber 100. A pumping port 120 disposed in the sidewalls 104 is coupled to a pumping system 122 that exhausts and controls the pressure of the interior volume 110. The lid assembly 108 of the processing chamber 100 works in cooperation with the lower shield 160 that interleaves with the cover ring 170, the middle shield 190, and an upper shield 195 to confine a plasma formed in the interior volume 110 to the region above the substrate.

A pedestal assembly 124 is supported from the bottom wall 106 of the chamber 100. The pedestal assembly 124 supports the deposition ring 180 along with the substrate 105 during processing. The pedestal assembly 124 is coupled to the bottom wall 106 of the chamber 100 by a lift mechanism 126 that is configured to move the pedestal assembly 124 between an upper and lower position. Additionally, in the lower position, lift pins may be moved through the pedestal assembly 124 to space the substrate 105 from the pedestal assembly 124 to facilitate exchange of the substrate 105 with a wafer transfer mechanism disposed exterior to the processing chamber 100, such as a single blade robot (not shown). A bellows 129 is typically disposed between the pedestal assembly 124 and the chamber bottom wall 106 to isolate the interior volume 110 of the chamber body 101 from the interior of the pedestal assembly 124 and the exterior of the chamber.

The pedestal assembly 124 generally includes a substrate support 128 sealingly coupled to a platform housing 130. The platform housing 130 is typically fabricated from a metallic material such as stainless steel or aluminum. A cooling plate (not shown) is generally disposed within the platform housing 130 to thermally regulate the substrate support 128. One pedestal assembly 124 that may be adapted to benefit from the invention is described in U.S. Pat. No. 5,507,499, issued Apr. 16, 1996 to Davenport et al., which is incorporated herein by reference in its entirety.

The substrate support 128 may be comprised of aluminum or ceramic. The substrate support 128 has a substrate receiving surface 132 that receives and supports the substrate 105 during processing, the substrate receiving surface 132 having a plane substantially parallel to a sputtering surface 134 of a sputtering target 136. The support 128 also has a peripheral wall 138 that terminates before an overhanging edge 107 of the substrate 105. The substrate support 128 may be an electrostatic chuck, a ceramic body, a heater or a combination thereof. In one embodiment, the substrate support 128 is an electrostatic chuck that includes a dielectric body having a conductive layer embedded therein. The dielectric body is typically fabricated from a high thermal conductivity dielectric material such as pyrolytic boron nitride, aluminum nitride, silicon nitride, alumina or an equivalent material.

The lid assembly 108 generally includes the target 136 and a magnetron 140. The lid assembly 108 is supported by the sidewalls 104 when in a closed position, as shown in FIG. 1. An isolator ring 142 is disposed between the target 136 and the upper shield 195 to prevent vacuum leakage therebetween and reduce electrical shorts between the chamber walls and the target 136. In one embodiment the upper shield 195 comprises a material such as aluminum or stainless steel.

The target 136 is coupled to the lid assembly 108 and exposed to the interior volume 110 of the processing chamber 100. The target 136 provides material which is deposited on the substrate during a PVD process. The isolator ring 142 is disposed between the target 136 and chamber body 101 to electrically isolate the target 136 from the chamber body 101. In one embodiment, the isolator ring 142 comprises a ceramic material.

The target 136 and pedestal assembly 124 are biased relative to each other by a power source 144. A gas, such as argon, is supplied to the interior volume 110 from a gas source 146 via conduits 148. The gas source 146 may comprise a non-reactive gas such as argon or xenon, which is capable of energetically impinging upon and sputtering material from the target 136. The gas source 146 may also include a reactive gas, such as one or more of an oxygen-containing gas and a nitrogen-containing gas, that are capable of reacting with the sputtering material to form a layer on a substrate. Spent process gas and byproducts are exhausted from the chamber 100 through pumping port 120 that receive spent process gas and pass the spent process gas to an exhaust conduit 121 having a throttle valve to control the pressure of the gas in the chamber 100. The exhaust conduit 148 is connected to the pumping system 122. Typically, the pressure of the sputtering gas in the chamber 100 is set to sub-atmospheric levels, such as a vacuum environment, for example, gas pressures of 1 mTorr to 400 mTorr. Plasma is formed between the substrate 105 and the target 136 from the gas. Ions within the plasma are accelerated toward the target 136 and cause material to become dislodged from the target 136. The dislodged target material is deposited on the substrate 105.

The magnetron 140 is coupled to the lid assembly 108 on the exterior of the processing chamber 100. The magnetron 140 includes at least one rotating magnet assembly (not shown) that promotes uniform consumption of the target 136 during the PVD process. One magnetron which may be utilized is described in U.S. Pat. No. 5,953,827, issued Sep. 21, 1999 to Or et al., which is hereby incorporated by reference in its entirety.

The chamber 100 is controlled by a controller 196 that comprises program code having instruction sets to operate components of the chamber 100 to process substrates in the chamber 100. For example, the controller 196 can comprise program code that includes a substrate positioning instruction set to operate the substrate support 128; a gas flow control instruction set to operate gas flow control valves to set a flow of sputtering gas to the chamber 100; a gas pressure control instruction set to operate a throttle valve to maintain a pressure in the chamber 100; a temperature control instruction set to control a temperature control system (not shown) in the support 128 or sidewall 104 to set temperatures of the substrate or sidewalls 104, respectively; and a process monitoring instruction set to monitor the process in the chamber 100.

A collimator 197 is coupled with the lower shield 160, thereby grounding the collimator. In one embodiment, the collimator may be a metal ring and includes an outer tubular section and at least one inner concentric tubular section, for example, three concentric tubular sections linked by struts.

Figure 2:
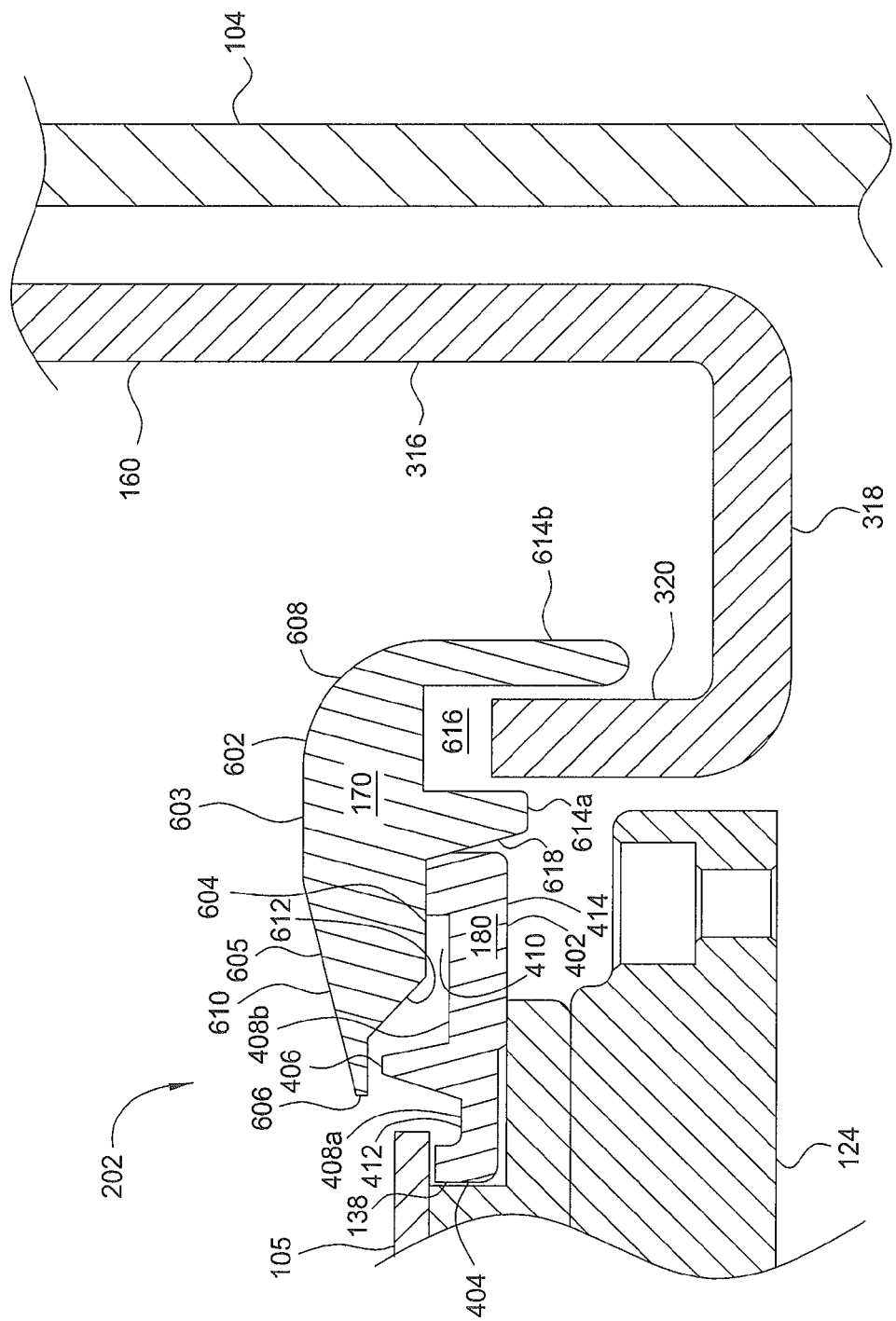
FIG. 2 is a partial sectional view of a process kit interfaced with a target and adapter of FIG. 1.

The chamber 100 also contains a process kit 150 which comprises various components that can be easily removed from the chamber 100, for example, to clean sputtering deposits off the component surfaces, replace or repair eroded components, or to adapt the chamber 100 for other processes. In one embodiment, the process kit 150 comprises a lower shield 160, a middle shield 190, and a ring assembly 202 for placement about a peripheral wall 138 of the substrate support 128 that terminates before an overhanging edge 107 of the substrate 105. As shown in FIG. 2, the ring assembly 202 comprises the deposition ring 180 and the cover ring 170. The deposition ring 180 comprises an annular band 402 surrounding the support 128. The cover ring 170 at least partially covers the deposition ring 180. The deposition ring 180 and the cover ring 170 cooperate with one another to reduce formation of sputter deposits on the peripheral wall 138 of the support 128 and the overhanging edge 107 of the substrate 105.

The lower shield 160 encircles the sputtering surface 134 of the sputtering target 136 that faces the substrate support 128 and the peripheral wall 138 of the substrate support 128. The lower shield 160 covers and shadows the sidewalls 104 of the chamber 100 to reduce deposition of sputtering deposits originating from the sputtering surface 134 of the sputtering target 136 onto the components and surfaces behind the lower shield 160. For example, the lower shield 160 can protect the surfaces of the support 128, the overhanging edge 107 of the substrate 105, sidewalls 104 and bottom wall 106 of the chamber 100.

Figure 3C:
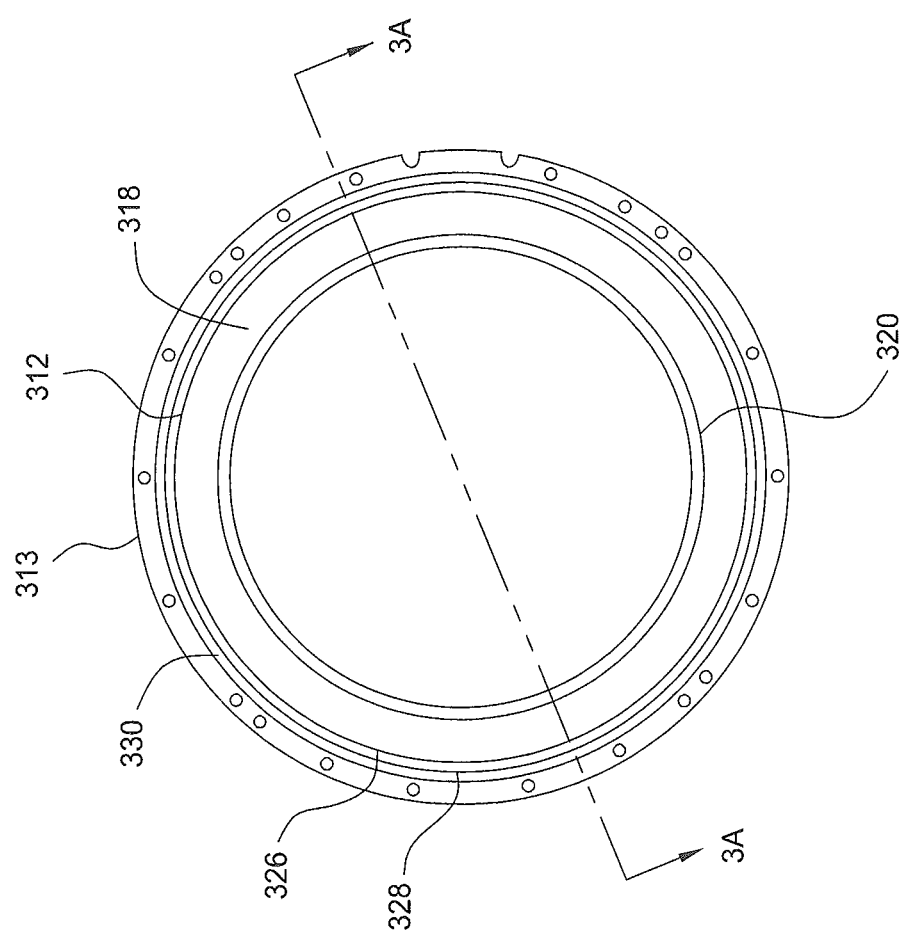
FIG. 3C is a top view of the lower shield of FIG. 3A.

FIGS. 3A and 3B are partial sectional views of a lower shield according to one embodiment described herein. FIG. 3C is a top view of the lower shield of FIG. 3A. As shown in FIG. 1 and FIGS. 3A-3C, the lower shield 160 is of unitary construction and comprises a cylindrical outer band 310 having a diameter dimensioned to encircle the sputtering surface 134 of the sputtering target 136 and the substrate support 128. The cylindrical outer band 310 has a top wall 312 that surrounds the sputtering surface 134 of the sputtering target 136. A support ledge 313 extends radially outward from the top wall 312 of the cylindrical outer band 310. The support ledge 313 comprises a resting surface 314 to rest upon a first annular adapter 172 surrounding the sidewalls 104 of the chamber 100. The resting surface 314 may have a plurality of slots shaped to receive a pin to align the lower shield 160 to the first annular adapter 172.

As shown in FIG. 3B, the top wall 312 comprises an inner periphery 326 and an outer periphery 328. The outer periphery 328 extends to form a sloped step 330. The sloped step 330 is angled radially outward between about 5 degrees and about 10 degrees from vertical, for example, about 8 degrees from vertical. In one embodiment, the inner periphery 326 is angled radially inward between about 2 degrees and about 5 degrees, for example, about 3.5 degrees from vertical.

The first annular adapter 172 supports the lower shield 160 and can serve as a heat exchanger about the sidewall 104 of the substrate processing chamber 100. The first annular adapter 172 and shield 160 form an assembly that allows for better heat transfer from the shield 160 to the adapter 172 and which reduces thermal expansion stresses on the material deposited on the shield. Portions of the shield 160 can become excessively heated by exposure to the plasma formed in the substrate processing chamber, resulting in thermal expansion of the shield and causing sputtering deposits formed on the shield to flake off from the shield and fall upon and contaminate the substrate 105. The first adapter 172 has a contact surface 174 that contacts the resting surface 314 of the lower shield 160 to allow good thermal conductivity between the shield 160 and the adapter 172. In one embodiment, the resting surface 314 of the shield 160 and the contact surface 174 of the first adapter 172 each have a surface roughness of from about 10 to about 80 microinches, or even from about 16 to about 63 microinches, or in one embodiment an average surface roughness of about 32 microinches. In one embodiment, the first adapter 172 further comprises conduits for flowing a heat transfer fluid therethrough to control the temperature of the first adapter 172.

Below the support ledge 313 of the lower shield 160 is a bottom wall 316 that surrounds the substrate support 128. A base plate 318 extends radially inward from the bottom wall 316 of the cylindrical outer band 310. A cylindrical inner band 320 is coupled with the base plate 318 and at least partially surrounding the peripheral wall 138 of the substrate support 128. The cylindrical inner band 320, the base plate 318, and the cylindrical outer band 310 form a U-shaped channel. The cylindrical inner band 320 comprises a height that is less than the height of the cylindrical outer band 310. In one embodiment, the height of the inner band 320 is about one fifth of the height of the cylindrical outer band 310. In one embodiment, the bottom wall 316 has a notch 322. In one embodiment, the cylindrical outer band 310 has a series of gas holes 324.

The cylindrical outer band 310, the top wall 312, the support ledge 313, the bottom wall 316, and the inner cylindrical band 320 comprise a unitary structure. For example, in one embodiment, the entire lower shield 160 can be made from 300 series stainless steel, or in another embodiment, aluminum. A unitary lower shield 160 is advantageous over prior shields which included multiple components, often two or three separate pieces to make up the complete lower shield. For example, a single piece shield is more thermally uniform than a multiple-component shield, in both heating and cooling processes. For example, the single piece lower shield 160 has only one thermal interface to the first adapter 172, allowing for more control over the heat exchange between the shield 160 and the first adapter 172. A shield 160 with multiple components makes it more difficult and laborious to remove the shield for cleaning. The single piece shield 160 has a continuous surface exposed to the sputtering deposits without interfaces or corners that are more difficult to clean out. The single piece shield 160 also more effectively shields the sidewalls 104 from sputter deposition during process cycles.

In one embodiment, the exposed surfaces of the lower shield 160 are treated with CLEANCOAT™, which is commercially available from Applied Materials, Santa Clara, Calif. CLEANCOAT™ is a twin-wire aluminum arc spray coating that is applied to substrate processing chamber components, such as the lower shield 160, to reduce particle shedding of deposits on the lower shield 160 and thus prevent contamination of a substrate 105 in the chamber 100. In one embodiment, the twin-wire aluminum arc spray coating on the lower shield 160 has a surface roughness of from about 600 to about 2300 microinches.

The lower shield 160 has exposed surfaces facing the interior volume 110 in the chamber 100. In one embodiment, the exposed surfaces are bead blasted to have a surface roughness of 175±75 microinches. The texturized bead blasted surfaces serve to reduce particle shedding and prevent contamination within the chamber 100. The surface roughness average is the mean of the absolute values of the displacements from the mean line of the peaks and valleys of the roughness features along the exposed surface. The roughness average, skewness, or other properties may be determined by a profilometer that passes a needle over the exposed surface and generates a trace of the fluctuations of the height of the asperities on the surface, or by a scanning electron microscope that uses an electron beam reflected from the surface to generate an image of the surface.

With reference to FIGS. 4A-4C, the deposition ring 180 comprises an annular band 402 that extends about and surrounds the peripheral wall 138 of the support 128 as shown in FIG. 2. The annular band 402 comprises an inner lip 404 which extends transversely from the band 402 and is substantially parallel to the peripheral wall 138 of the support 128. The inner lip 404 terminates immediately below the overhanging edge 107 of the substrate 105. The inner lip 404 defines an inner perimeter of the deposition ring 180 which surrounds the periphery of the substrate 105 and substrate support 128 to protect regions of the support 128 that are not covered by the substrate 105 during processing. For example, the inner lip 404 surrounds and at least partially covers the peripheral wall 138 of the support 128 that would otherwise be exposed to the processing environment, to reduce or even entirely preclude deposition of sputtering deposits on the peripheral wall 138. Advantageously, the deposition ring 180 can be easily removed to clean sputtering deposits from the exposed surfaces of the ring 180 so that the support 128 does not have to be dismantled to be cleaned. The deposition ring 180 can also serve to protect the exposed side surfaces of the support 128 to reduce their erosion by the energized plasma species.

In the embodiment shown in FIG. 2, the annular band 402 of the deposition ring 180 has a v-shaped protuberance 406 that extends along the central portion of the band 402 with a first radially inward recess 408a and a second radially inward recess 408b on either side of the v-shaped protuberance 406. In one embodiment, the opposing surfaces of the v-shaped protuberance 406 form an angle "α". In one embodiment, the angle "α" is between about 25° and about 30°. In another embodiment, the angle "α" is between about 27° and about 28°. The first radially inward recess 408a is located in a horizontal plane slightly below the horizontal plane of the second radially inward recess 408b. In one embodiment, the second radially inward recess 408b has a width between about 0.8 inches and about 0.9 inches. In another embodiment, the second radially inward recess 408b has a width between about 0.83 inches and about 0.84 inches. In one embodiment, the first radially inward recess 408a and the second radially inward recess 408b are substantially parallel to a bottom surface 420 of the deposition ring 180. The second radially inward recess 408b is spaced apart from the cover ring 170 to form an arc-shaped channel 410 therebetween which acts as a labyrinth to reduce penetration of plasma species into the arc-shaped channel 410, as shown in FIG. 2. An open inner channel 412 lies between the inner lip 404 and the v-shaped protuberance 406. The open inner channel 412 extends radially inward to terminate at least partially below the overhanging edge 107 of the substrate 105. The open inner channel 412 facilitates the removal of sputtering deposits from these portions during cleaning of the deposition ring 180. The deposition ring 180 also has a ledge 414 which extends outward and is located radially outward of the V-shaped protuberance 406. The ledge 414 serves to support the cover ring 170. The bottom surface 420 of the annular band 402 has a notch 422 which extends from the inner lip 404 under the V-shaped protuberance 406. In one embodiment, the notch has a width between about 0.6 inches and about 0.75 inches. In another embodiment, the notch has a width between about 0.65 inches and about 0.69 inches. In one embodiment, the notch has a height between about 0.020 inches and about 0.030 inches. In another embodiment, the notch has a height between about 0.023 inches and about 0.026 inches.

In one embodiment, the second radially inward recess 408b has an outer diameter shown by arrows "A". In one embodiment, the diameter "A" of the second radially inward recess 408b may be between about 13 inches and about 13.5 inches. In another embodiment, the diameter "A" of the second radially inward recess 408b may be between about 13.1 inches and about 13.2 inches. In one embodiment, the second radially inward recess 408b has an inner diameter shown by arrows "E". In one embodiment, the diameter "E" of the second radially inward recess 408b may be between about 12 inches and about 12.5 inches. In another embodiment, the diameter "E" may be between about 12.2 inches and 12.3 inches.

In one embodiment, the annular band 402 has a diameter as shown by arrows "D". In one embodiment, the diameter "D" of the annular band 402 may be between about 11 inches and about 12 inches. In another embodiment, the diameter "D" of the annular band 402 may be between about 11.25 inches and about 11.75 inches. In yet another embodiment, the diameter "D" of the annular band 402 may be between about 11.40 inches and about 11.60 inches. In one embodiment, the annular band 402 has an outer diameter as shown by arrows "F". In one embodiment, the diameter "F" of the annular band 402 may be between about 13 inches and about 14 inches. In another embodiment, the diameter "F" of the annular band 402 may be between about 13.25 inches and about 13.75 inches. In yet another embodiment, the diameter "F" may be between 13.40 inches and about 13.60 inches.

In one embodiment the top of the v-shaped protuberance has a diameter shown by arrows "B". In one embodiment, the diameter "B" may be between about 12 inches and about 12.3 inches. In another embodiment, the diameter "B" may be between about 12.1 inches and about 12.2 inches.

In one embodiment, the inner lip 404 has an outer diameter shown by arrows "C". In one embodiment, the diameter "C" may be between about 11 inches and about 12 inches. In another embodiment, the diameter "C" may be between about 11.5 inches and about 11.9 inches. In yet another embodiment, the diameter "C" may be between about 11.7 inches and about 11.8 inches.

The deposition ring 180 can be made by shaping and machining a ceramic material, such as aluminum oxide. Preferably, the aluminum oxide has a purity of at least about 99.5 percent to reduce contamination of the chamber 100 by undesirable elements such as iron. The ceramic material is molded and sintered using conventional techniques such as isostatic pressing, followed by machining of the molded sintered preform using suitable machining methods to achieve the shape and dimensions required.

The annular band 402 of the deposition ring 180 may comprise an exposed surface that is grit blasted. Grit blasting is performed with a grit size suitable to achieve the predefined surface roughness. In one embodiment, a surface of the deposition ring 180 is treated with a twin-wire aluminum arc-spray coating, such as, for example, CLEANCOAT™, to reduce particle shedding and contamination.

Figure 5A:
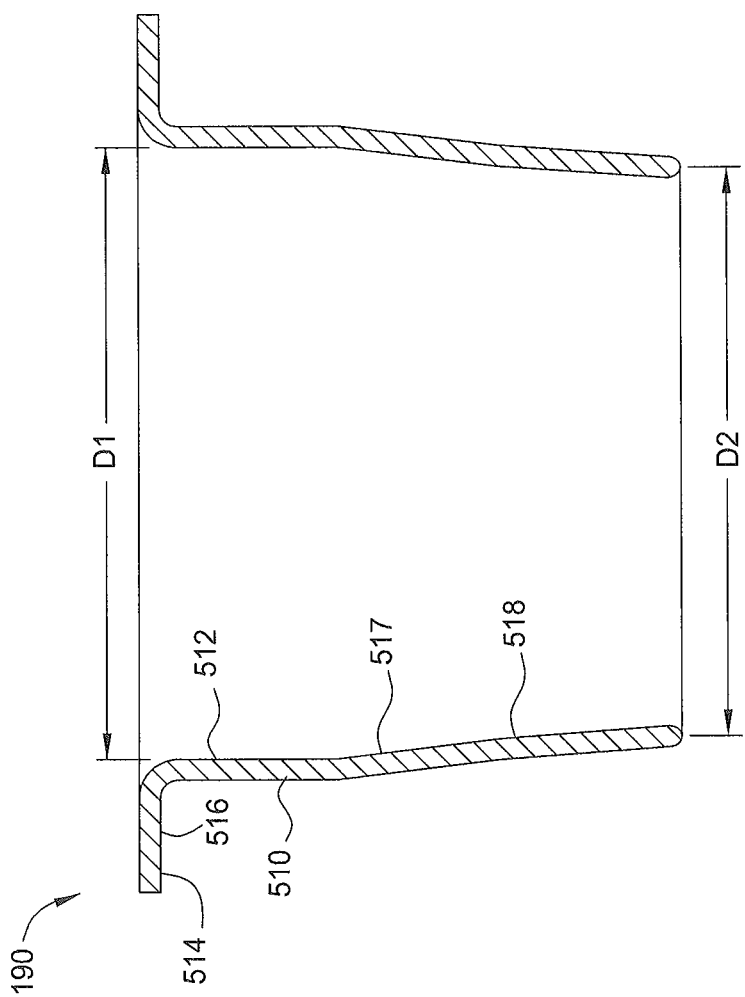
FIG. 5A is a partial section view of a middle shield according to one embodiment described herein.
Figure 5B:
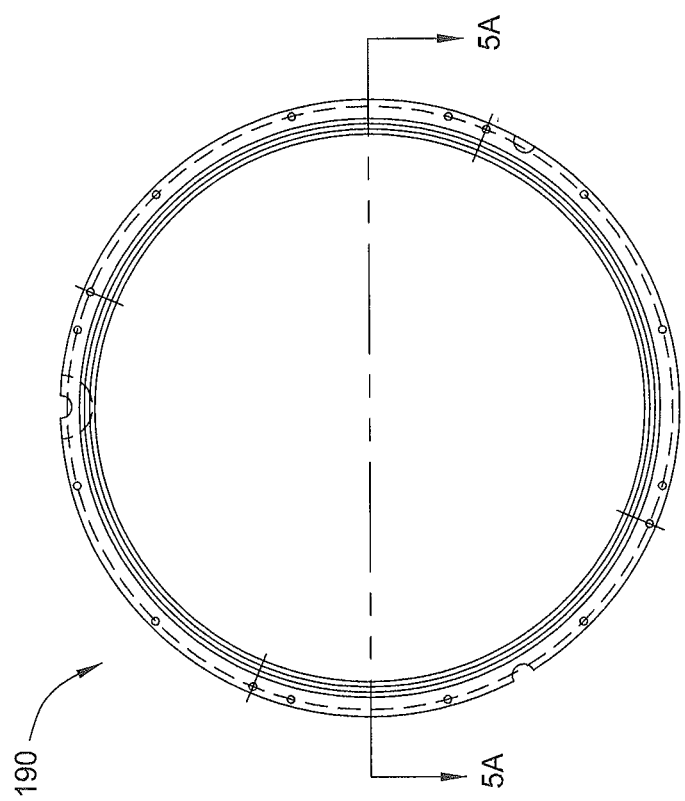
FIG. 5B is a top view of the middle shield of FIG. 5A.

FIG. 5A is a partial section view of a middle shield 190 according to one embodiment described herein. The middle shield 190 encircles the sputtering surface 134 of the sputtering target 136 that faces the substrate support 128. The middle shield 190 covers and shadows the top wall 312 of the lower shield 160 and the sidewalls 104 of the chamber 100 to reduce deposition of sputtering deposits originating from the sputtering surface 134 of the sputtering target 136 onto the components and surfaces behind the middle shield 160.

As shown in FIG. 1 and FIG. 5A, the middle shield 160 is of unitary construction and comprises a cylindrical band 510 having a first diameter D1 dimensioned to encircle the upper shield 195. The cylindrical outer band 310 has a top wall 512 that surrounds the upper shield 195, a middle wall 517, and a bottom wall 518. A mounting flange 514 extends radially outward from the top wall 512 of the cylindrical band 510. The mounting flange 514 comprises a resting surface 516 to rest upon a second annular adapter 176 surrounding the sidewalls 104 of the chamber 100. The resting surface may comprise a plurality of slots shaped to receive a pin to align the middle shield 190 to the adapter 176.

The middle wall 517 is an extension of the top wall 512. The middle wall 517 is sloped radially inward from the top wall 512 beginning at a transition point between the top wall 512 and the middle wall 517. In one embodiment the middle wall 517 is angled between about 5° and about 10° from vertical, for example, about 7° from vertical. The middle wall 517 of the cylindrical band forms a second diameter D2. The second diameter D2 is dimensioned to fit within the sloped portion of the top wall 312 of the lower shield 160.

The bottom wall 518 is an extension of the middle wall 517. The bottom wall 518 is sloped radially outward relative to the middle wall 517 beginning at a transition point between the middle wall 517 and the bottom wall 518. In one embodiment the bottom wall 518 is angled between about 1° and about 5° from vertical, for example, about 4° from vertical.

The top wall 512, the middle wall 517, the bottom wall 518, and the mounting flange 514 comprise a unitary structure. For example, in one embodiment, the entire middle shield 190 can be made from 300 series stainless steel, or in another embodiment, aluminum.

With reference to FIGS. 1, 2, 6A, 6B, and 6C, the cover ring 170 encircles and at least partially covers the deposition ring 180 to receive, and thus, shadow the deposition ring 180 from the bulk of the sputtering deposits. The cover ring 170 is fabricated from a material that can resist erosion by the sputtering plasma, for example, a metallic material such as stainless steel, titanium or aluminum, or a ceramic material, such as aluminum oxide. In one embodiment, the cover ring 170 is composed of titanium having a purity of at least about 99.9 percent. In one embodiment, a surface of the cover ring 170 is treated with a twin-wire aluminum arc-spray coating, such as, for example, CLEANCOAT™, to reduce particle shedding from the surface of the cover ring 170. The cover ring has an outer diameter shown by arrows "H". In one embodiment, the diameter "H" is between about 14.5 inches and about 15 inches. In another embodiment, the diameter "H" is between about 14.8 inches and about 14.9 inches. The cover ring has an inner diameter shown by arrows "I". In one embodiment, the diameter "I" is between about 11.5 inches and about 12.5 inches. In another embodiment, the diameter "I" is between about 11.8 inches and about 12.2 inches. In yet another embodiment, the diameter "I" is between about 11.9 inches and about 12.0 inches.

The cover ring 170 comprises an annular wedge 602. The annular wedge comprises a top surface 603 and a bottom surface 604 to rest upon the ledge 414 of the deposition ring 180. The top surface 603 is substantially parallel to the bottom surface 604. An inclined top surface 603 couples the top surface 603 with a projecting brim 610. The inclined top surface 605 is sloped radially inwards and encircles the substrate support 128. The inclined top surface 605 of the annular wedge 602 has an inner and outer periphery 606, 608. The inner periphery 606 comprises the projecting brim 610 which overlies the second radially inward recess 408b of the deposition ring 180 forming an arc shaped channel 410 of the deposition ring 180. The projecting brim 610 reduces deposition of sputtering deposits on the arc shaped channel 410 of the deposition ring 180. Advantageously, the projecting brim 610 projects a distance corresponding to at least about half the width of the open inner channel 412 formed with the deposition ring 180. The projecting brim 610 is sized, shaped, and positioned to cooperate with and complement the arc-shaped channel 410 and open inner channel 412 to form a convoluted and constricted flow path between the cover ring 170 and deposition ring 180 that inhibits the flow of process deposits onto the peripheral wall 138. The constricted flow path of the arc-shaped channel 410 restricts the build-up of low-energy sputter deposits on the mating surfaces of the deposition ring 180 and the cover ring 170, which would otherwise cause them to stick to one another or to the peripheral overhanging edge of the substrate 105. The open inner channel 412 of the deposition ring 180 which extends underneath the overhanging edge 107 of the substrate 105 is designed in conjunction with shadowing from the projecting brim 610 of the cover ring 170 to collect, for example, aluminum sputter deposits in an aluminum sputtering chamber, while reducing or even substantially precluding sputter deposition on the mating surfaces of the two rings 170, 180.

The inclined top surface 605, in cooperation with the projecting brim 610, block line-of-sight deposition from exiting the interior volume 110 and entering the chamber body cavity. The inclined top surface 605 may be slanted at an angle relative to the top surface 603 as shown by angle "β". In one embodiment, the angle "β" may be between about 5 degrees and about 15 degrees. In another embodiment, the angle "β" is between about 9 degrees and about 11 degrees. In one embodiment, the angle "β" is about 10 degrees. The angle of the inclined top surface 605 of the cover ring 170 is designed, for example, to minimize the buildup of sputter deposits nearest to the overhanging edge 107 of the substrate 105, which would otherwise negatively impact the deposition uniformity obtained across the substrate 105.

The cover ring 170 further comprises a sloped step 612 located below the inclined top surface 605 of the annular wedge 602. The sloped step 612 couples the projecting brim 610 with the bottom surface 604. The sloped step 612 extends downwardly from the annular wedge 602 and radially outward from the inner periphery 606. The sloped step 612 may be slanted at an angle relative to the bottom surface as shown by angle "γ". In one embodiment, angle "γ" may be between about 40 degrees and about 50 degrees. In another embodiment, angle "γ" may be between about 42 degrees and about 48 degrees. In yet another embodiment, angle "γ" may be between about 44 degrees and about 46 degrees.

The sloped step has an inner diameter shown by arrows "J". In one embodiment, the diameter "J" of the sloped step 612 is between about 12 inches and about 13 inches. In another embodiment, the diameter "J" of the sloped step 612 is between about 12.2 and about 12.5 inches. In yet another embodiment, the diameter "J" of the sloped step 612 is between about 12.3 inches and about 12.4 inches. The sloped step 612 also has a diameter shown by arrows "K". In one embodiment, the diameter "K" of the sloped step 612 is between about 12.5 and about 13 inches. In another embodiment, the diameter "K" of the sloped step 612 is between about 12.7 inches and about 12.8 inches. In one embodiment, the diameter "K" of the sloped step 612 functions as the inner diameter of the bottom surface 604.

The bottom surface has an outer diameter shown by arrows "L". In one embodiment, the diameter "L" of the bottom surface is between about 13.5 and about 13.8 inches. In another embodiment, the diameter "L" is between about 13.4 inches and about 13.5 inches.

The cover ring 170 further comprises an inner cylindrical band 614a and an outer cylindrical band 614b that extend downwardly from the annular wedge 602, with a gap 616 therebetween. In one embodiment, the gap 616 has a width between 0.5 inches and about 1 inch. In another embodiment, the gap 616 has a width between about 0.7 inches and about 0.8 inches. In one embodiment, the inner and outer cylindrical bands 614a, 614b are substantially vertical. The cylindrical bands 614a, 614b are located radially outward of the sloped step 612 of the wedge 602. An inner periphery 618 of the inner cylindrical band 614a is coupled with the bottom surface 604. In one embodiment, the inner periphery 618 of the inner cylindrical band 614a may be slanted at an angle "φ" from vertical. In one embodiment, the angle "φ" is between about 10 degrees and about 20 degrees. In another embodiment, the angle "φ" is between about 14 degrees and about 16 degrees.

The inner cylindrical band 614a has a height that is smaller than the outer cylindrical band 614b. Typically, the height of the outer cylindrical band 614b is at least about 2 times the height of the inner cylindrical band 614a. In one embodiment, the height of the outer cylindrical band 614b is between about 0.4 inches and about 1 inch. In another embodiment, the height of the outer cylindrical band 614b is between 0.6 inches and 0.7 inches. In one embodiment, the height of the inner cylindrical band 614a is between about 0.2 inches and 0.6 inches. In another embodiment, the height of the inner cylindrical band 614a is between about 0.3 inches and 0.4 inches.

In one embodiment, the outer diameter "L" of the bottom surface functions as the inner diameter of the inner cylindrical band 614a. The inner cylindrical band 614a has an outer diameter shown by arrows "M". In one embodiment, the diameter "M" of the inner cylindrical band 614a is between about 13.5 inches and about 14.2 inches. In another embodiment, the diameter "M" of the inner cylindrical band 614a is between about 13.7 and 14 inches. In yet another embodiment, the diameter "M" of the inner cylindrical band is between about 13.8 inches and about 13.9 inches.

In one embodiment, the outer cylindrical band 614b has an inner diameter as shown by arrows "N". In one embodiment, the diameter "N" is between about 14 inches and about 15 inches. In another embodiment, the diameter "N" of the outer cylindrical band 614b is between about 14.2 inches and about 14.8 inches. In another embodiment, the diameter "N" of the outer cylindrical band 614b is between about 14.5 inches and about 14.6 inches. In one embodiment, the diameter "H" of the cover ring functions as the outer diameter of the outer cylindrical band "H".

In one embodiment, the cover ring 170 is adjustable and effectively shields conductance holes in the lower shield 160 at a range of different heights. For example, the cover ring 170 is capable of being raised and lowered to adjust the height of the cover ring 170 in relationship to the substrate support 128 in the chamber 100.

The space or gap between the lower shield 160 and cover ring 170 forms a convoluted S-shaped pathway or labyrinth for plasma to travel. The shape of the pathway is advantageous, for example, because it hinders and impedes ingress of plasma species into this region, reducing undesirable deposition of sputtered material.

While the foregoing is directed to embodiments of the present invention, other and further embodiments of the invention may be devised without departing from the basic scope thereof, and the scope thereof is determined by the claims that follow.

The invention claimed is:

1. A cover ring configured to encircle and at least partially shadow a deposition ring from sputtering deposits, comprising:
   an annular wedge, comprising:
     a continuous inner periphery along a first radius and a continuous outer periphery along a second radius;
     a top surface extending from the outer periphery toward the inner periphery;
     a bottom surface to rest upon a ledge of a deposition ring, wherein the top surface is substantially parallel to the bottom surface;
     an inclined top surface extending from the top surface and toward the continuous inner periphery, the inclined top surface extending from the top surface downward and inward; and
     a projecting brim forming the continuous inner periphery along the first radius and coupled with the top surface by the inclined top surface, wherein the projecting brim extends the angle of the inclined top surface to the continuous inner periphery and blocks sputtering deposits from passing below the projecting brim, the projecting brim comprising:
       a projecting brim bottom surface directly coupled to the continuous inner periphery and parallel to both the bottom surface and the top surface of the annular wedge; and
     an inner cylindrical band and an outer cylindrical band, the inner cylindrical band aligned below the top surface, both inner and outer cylindrical bands being continuous in shape and extending downward from the annular wedge, the inner cylindrical band having a smaller height than the outer cylindrical band and the outer cylindrical band forms the continuous outer periphery along the second radius.

2. The cover ring of claim 1, further comprising a sloped step located below the inclined top surface of the annular wedge and coupling the projecting brim with the bottom surface.

3. The cover ring of claim 2, wherein the sloped step extends downwardly from the annular wedge and radially outward from the inner periphery.

4. The cover ring of claim 3, wherein the sloped step is slanted at an angle relative to the bottom surface between about 40 degrees and about 50 degrees.

5. The cover ring of claim 1, wherein the cover ring is fabricated from a material selected from the group comprising stainless steel, titanium, aluminum, aluminum oxide, and combinations thereof.

6. The cover ring of claim 1, wherein a surface of the cover ring is treated with a twin-wire aluminum arc-spray coating.

7. The cover ring of claim 1, wherein the cover ring has an outer diameter between about 14.5 inches and about 15 inches and an inner diameter between about 11.5 inches and about 12.5 inches and wherein the angle of the inclined top surface is between about 5 degrees and about 15 degrees.

8. The cover ring of claim 1, wherein the inclined top surface is coplanar with a top portion of the projecting brim.

9. A cover ring configured to encircle and at least partially shadow a deposition ring from sputtering deposits, comprising:
   an annular wedge, comprising:
     a continuous inner periphery along a first radius and a continuous outer periphery along a second radius;
     a top surface extending from the outer periphery toward the inner periphery;
     a bottom surface to rest upon a ledge of a deposition ring, wherein the top surface is substantially parallel to the bottom surface;
     an inclined top surface extending from the top surface and toward the continuous inner periphery, the inclined top surface extending from the top surface downward and inward; and
     a projecting brim forming the continuous inner periphery along the first radius and coupled with the top surface by the inclined top surface, wherein the projecting brim extends the angle of the inclined top surface to the continuous inner periphery, the projecting brim blocking sputtering deposits from passing below the projecting brim, the projecting brim comprising:

a projecting brim bottom surface directly coupled to the continuous inner periphery and parallel to both the bottom surface and the top surface of the annular wedge; and a sloped step located below the inclined top surface of the annular wedge and coupling the projecting brim with the bottom surface; and an inner cylindrical band and an outer cylindrical band, the inner cylindrical band aligned below the top surface, both inner and outer cylindrical bands being continuous in shape and extending downward from the annular wedge, the inner cylindrical band having a smaller height than the outer cylindrical band and the outer cylindrical band forms the continuous outer periphery along the second radius.

* * * * *